United States Patent [19]

Basire et al.

[11] Patent Number: 4,488,262

[45] Date of Patent: Dec. 11, 1984

[54] ELECTRONICALLY PROGRAMMABLE READ ONLY MEMORY

[75] Inventors: Dominique Basire, Chailly-En-Biere, France; Arup Bhattacharyya, Essex Junction, Vt.; James K. Howard, Morgan Hill, Calif.; Pierre Mollier, Boissise-Le-Roi-Saint Fargeau Ponthierry, France

[73] Assignee: International Business Machines Corporation, Armonk, N.Y.

[21] Appl. No.: 389,204

[22] Filed: Jun. 17, 1982

[30] Foreign Application Priority Data

Jun. 25, 1981 [EP] European Pat. Off. ........ 81430019.0

[51] Int. Cl.³ .............................................. G11C 11/40
[52] U.S. Cl. ..................................... 365/104; 365/100
[58] Field of Search ................... 365/100, 104; 357/45

[56] References Cited

U.S. PATENT DOCUMENTS

| 3,576,549 | 4/1971 | Hess | 340/173 SP |
| 3,787,822 | 1/1974 | Rioult | 340/173 SP |
| 3,876,944 | 4/1975 | Mack et al. | 340/347 |
| 3,979,734 | 9/1976 | Pricer et al. | 340/173 CA |
| 4,174,521 | 11/1979 | Neale | 357/45 |
| 4,176,442 | 12/1979 | Bischoff et al. | 365/104 |
| 4,312,046 | 1/1982 | Taylor | 365/104 |
| 4,424,578 | 1/1984 | Miyamoto | 365/104 |

OTHER PUBLICATIONS

Bracco et al., IBM Technical Disclosure Bulletin, vol. 13, No. 5, Oct. 1970, "Write-Once Read Only Store", p. 1308.
Abbas, IBM Technical Disclosure Bulletin, vol. 13, No. 6, Nov. 1970, "Electrically Encoatable Read-Only Store", 1426-1427.
Herrell et al., IBM Technical Disclosure Bulletin, vol. 15, No. 3, Aug. 1972, "Write Once Read-Only Store", pp. 949-950.
Hnatek, *Micro Electronics Reliability*, vol. 18, pp. 325-332 entitled "Bipolar PROM Reliability".
Ramachandrin, *Electronics*, Jul. 6, 1978, pp. 106-111, "Single-Supply Erasable PROM Saves Power with C-MOS Process".
Seaward et al., *Extended Abstracts*, vol. 77, No. 2, pp. 945-950, Oct. 1977, "Uniformity of Oxygen Doped Polysilicon Films".
*Chemical Abstracts*, vol. 86, No. 8, p. 415, No. 49598r, Feb. 1977, "Thin Ferroelectric Films of Barium Titanate on Doped Silicon" by the Electrical Engineering Department of the University of New Mexico at Albequerque.

*Primary Examiner*—Terrell W. Fears
*Attorney, Agent, or Firm*—Douglas A. Lashmit

[57] ABSTRACT

An electrically programmable read only memory assembly having cells arranged at the intersections of bit lines (BL1) and word lines (WL1, WL2), wherein each cell is formed of a bipolar transistor provided with a base region (70) and an emitter region (71) covered with a dielectric layer (2) made of an oxide or titanate of a transition metal. The cell in this condition represents a binary 0 information bit. The application of an appropriate voltage of approximately 4 volts to the pads of this cell through its corresponding bit line (BL1) and word line (WL2) causes the dielectric layer to break down and places the bit line in ohmic contact with the emitter, which sets the cell in its second condition representing a binary "1" information bit.

10 Claims, 8 Drawing Figures

BEFORE PROGRAMMING COND. 0

AFTER PROGRAMMING COND. 1

BEFORE PROGRAMMING
COND. 0

AFTER PROGRAMMING COND. 1

$f_A = 10^{-15}$ AMP a BEFORE BREAKINGDOWN
b AFTER BREAKINGDOWN

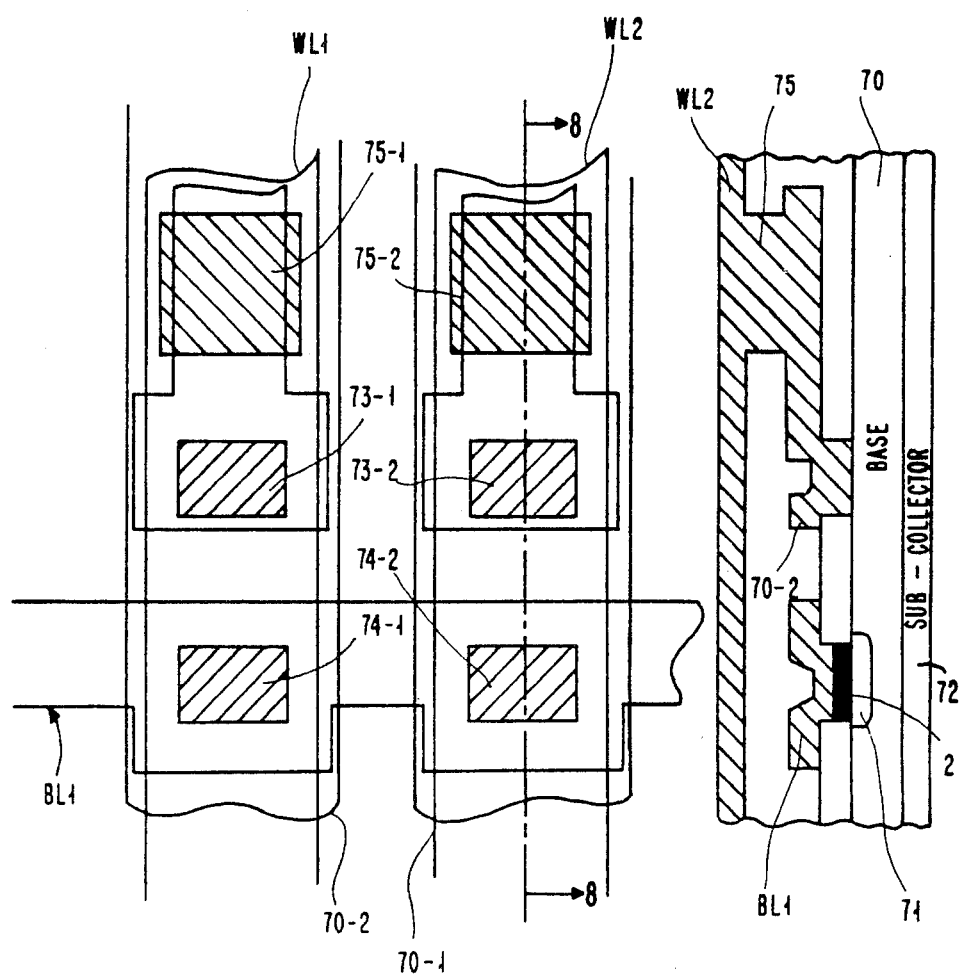

ELECTRONICALLY PROGRAMMABLE READ ONLY MEMORY

BACKGROUND OF INVENTION

1. Field of Invention

This invention relates generally to read only memories and more particularly to an electronically programmable read only memory of high integration density which is capable of high speed operation.

2. Prior Art

Read only memories (ROMs) are widely used in data processing equipment. Generally, ROMs are used to constitute tables containing fixed data intended only to be read in the course of equipment operation. ROMs, for example, are used to hold the data words which control the instructions of a program in a computer control unit or a microprocessor. Additionally, ROMs may be used to form the AND and OR matrices of a programmable logic array (PLAs).

In these applications, it is desirable for the ROM to operate at the highest possible speed and in fact a speed substantially equal to the operating speed of the random access memories (RAMs) which contains the variable data the ROM data will be associated with during equipment operation. In addition, it is desirable for the programming operation required to load data in a ROM to be as simple as possible to retain the ROM's desirability of use.

Currently, there are various types of ROMs. For example, there are ROMs which are programmed during manufacturing. These ROMs have a high integration density obtained by making the ROM as an array of cells, each cell having only one bipolar transistor. The cells are personalized, i.e., loaded with a "0"s and "1"s pattern when made by providing an open circuit (0) or not providing an open circuit (1) at the cell transistor's emitter. This type ROM exhibits high operating speed and integration density but unfortunately cannot be personalized, i.e., programmed, by the user.

There are also ROMs which can be electrically programmed, i.e., programmable read only memories (PROMs) which may be personalized by the user. An example of such a ROM is a structure that features floating gate CMOS transistors as described in the article entitled "Single-Supply Erasable PROM Saves Power with C-MOS Process" appearing in the July 6, 1978 issue of the publication *Electronics* at pages 106-111. This type of device, however, does not operate at a speed high enough to satisfy the needs of many potential users.

Generally, user programmable ROMs having high operating speed, e.g., 5 to 10 ns access/cycle time feature a matrix of memory cells, each of which includes a bipolar transistor having a fusable resistor connected to the transistor emitter. In this arrangement, the resistor is fused open or left intact to establish either a "0" or "1" binary level in the cell. Typically, the user fuses the resistor open by driving a high current through it.

Such memories are described in the article entitled "Bipolar PROM Reliability" which appears in the publication *Micro Electronics Reliability* Vol. 18 at pages 325 to 332, Paragon Press. Unfortunately, in this type of PROM, the fusable resistor requires an undesirably large amount of space and, therefore, does not permit the component integration density desired.

There are also PROMs in which a dielectric is placed in series with the cell transistor emitter and either left intact to program a "0" at the cell or broken down by the application of a high voltage to program a "1" in the cell. An example of this type of PROM is found in U.S. Pat. No. 3,576,549, issued to Hess et al. PROMs of this type, however, use a high dielectric strength material, for example, silicon dioxide, alumina, silicon nitride, etc. Therefore, for the dielectric thicknesses which can be readily achieved, these layers have high breakdown voltages, e.g., 5 to 100 v. Such voltages unfortunately create difficulty in high integration density circuits and make programming of the PROM by the user inconvenient.

It has been possible to achieve high speed at high integration density in certain types of dynamic RAMs. Particularly where a capacitor is connected to the emitter of a bipolar transistor, a binary "1" or "0" may be represented by charging or not charging the capacitor. Such an arrangement is described in U.S. Pat. Nos. 3,979,734 and 3,876,944 respectively entitled "Multiple Emitter Charge Storage Memory Cell" and "Dibinary Encoding Technique" issued to W. D. Pricer et al and D. E. Mack et al on Sept. 7, 1976 and Apr. 8, 1975. Unfortunately, however, because the capacitor charge is volatile, i.e., it requires refreshing, such a structure is unsuited for a ROM which must maintain the information loaded into it.

SUMMARY

Accordingly, an object of this invention is to provide an electronically programmable read only memory (PROM) having a high integration density and capable of operating at speeds comparable to those achieved with dynamic bipolar random access memories.

Briefly, the present invention concerns a PROM wherein the cells used to build the memory include a bipolar transistor having an emitter which is overlaid, i.e., connected in series with, a thin film of dielectric material. The thin film dielectric material is selected and arranged to have a predetermined breakdown characteristic such that when the potential across the dielectric layer is approximately 1 volt, the leakage current through the layer is small, e.g., $10^{-9}$ to $10^{-5}$ amps, but when the potential across the dielectric layer is increased to greater than approximately 3.5 volts, the dielectric layer breaks down. When the dielectric layer is caused to break down, an ohmic contact is established at the emitter which is of low resistance.

To form a PROM, the memory cells are arranged at the intersections of a matrix of bit and word lines. In this arrangement, the bit lines overlie one surface of the dielectric layer, the other surface of the dielectric layer overlying the transistor emitter. The word lines in this arrangement are connected to the base of an associated transistor. To program the memory, means are provided to cause the dielectric layers associated with each cell to break down or not break down depending on whether it is designed to load a "1" or "0" respectively at a cell. In accordance with our invention the dielectric layer is preferred to be an oxide or a titanate of a transition metal to achieve a convenient programming voltage.

Additional features of this invention as well as further objectives and advantages will become clear from the following detailed description, taken in conjunction with the accompanying drawings.

BRIEF DESCRIPTION OF THE DRAWINGS

FIG. 7 is a top plan view of two integrated memory cells in accordance with this invention.

FIG. 8 is a cross-section taken along lines 8—8 of FIG. 7.

DETAILED DESCRIPTION OF THE PREFERRED EMBODIMENT

Figure 1:
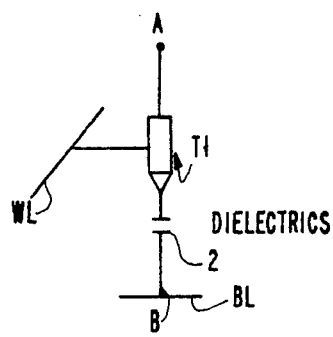
FIG. 1 is a schematic diagram of a memory cell in accordance with this invention before programming.
Figure 4:
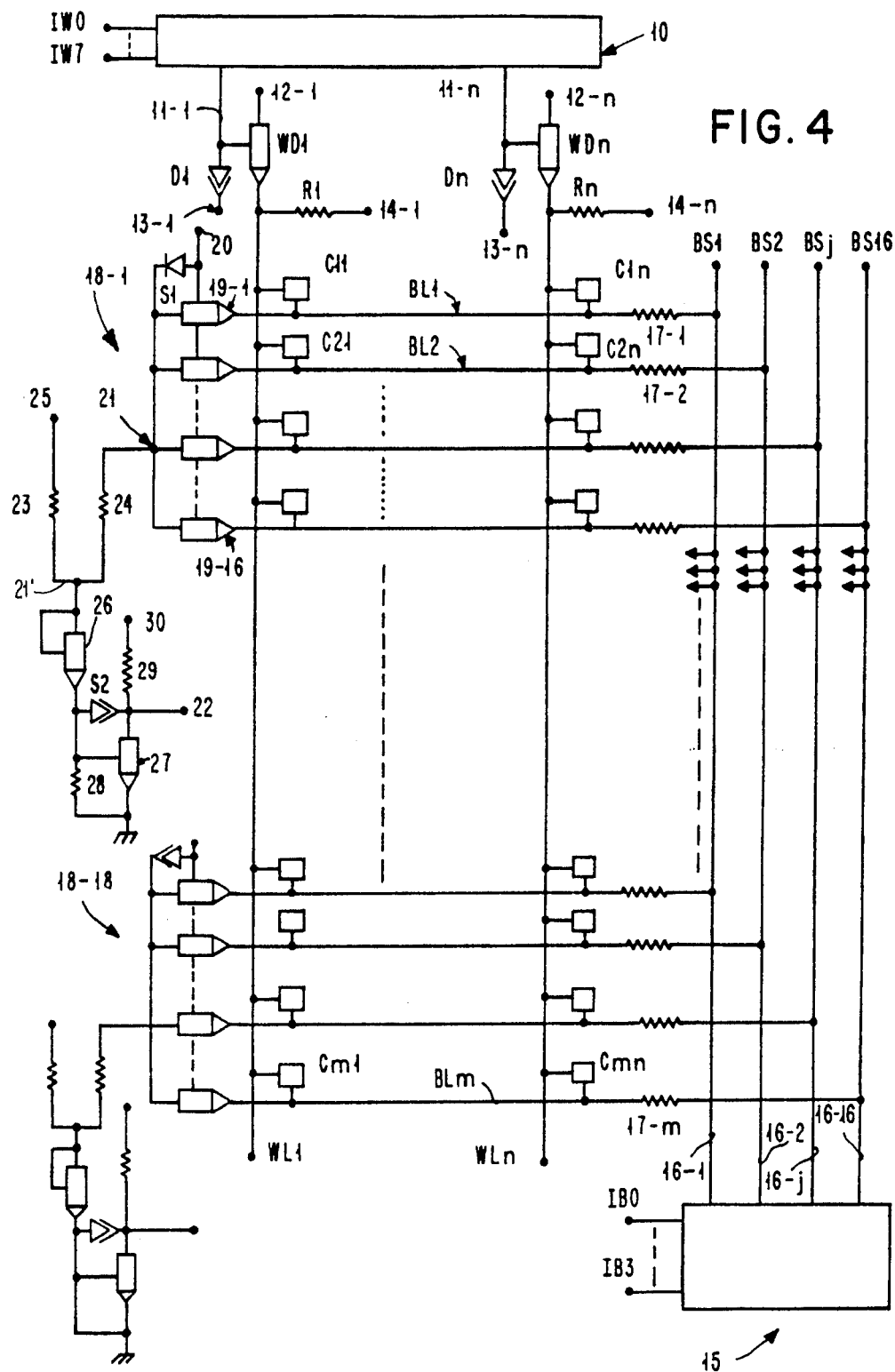
FIG. 4 is a schematic diagram of a cell arrangement for a PROM in accordance with this invention.

A schematic illustration of a memory cell in accordance with this invention is shown in FIG. 1. When the memory array is made, each cell is provided with a transistor T1 which, in preferred form, is of the NPN type. The collector of transistor T1 is connected to a biasing voltage source shown in FIG. 1 as A. The base of transistor T1 as shown is connected to a word line WL and the emitter, i.e., at least a portion of the transistor's emitter region, is overlaid with a dielectric layer. The dielectric layer itself is at least partially overlaid with metallization which is connected to a bit line BL. The combination of transistor emitter and dielectric layer is schematically shown in FIG. 1 as a capacitor 2 connected in series with the emitter of transistor T1. Capacitor 2 as noted is also connected to a bit line BL at B, thus in effect coupling transistor T1's emitter to bit line BL. In this condition, the cell represents a binary "0" state. The user who first acquires the structure after its manufacture is thus provided with a read only memory having an array of cells as shown in FIG. 4, all of which are in "0" states.

Figure 2:
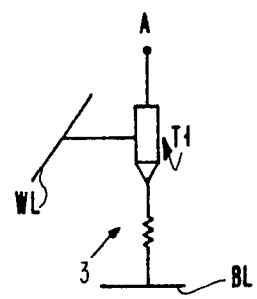
FIG. 2 is a schematic diagram of a memory cell in accordance with this invention after programming.

To program the memory with a pattern of "1"'s and "0"'s, i.e., personalize the memory cells with data, appropriate voltages are applied to selected cells over the bit and word lines. The voltage applied causes the breakdown of the dielectric at those cells where "1"'s are desired to be loaded. Where the dielectric is caused to break down, a resistive element 3 results as shown in FIG. 2. This resistive element establishes an ohmic contact between transistor T1 and bit line BL as shown in FIG. 2.

To accomplish the programming, the voltage supplied at A is increased above the normal operating level. In a preferred embodiment, the supply voltage is caused to rise from 3.4 volts to 5 volts. Additionally, a "1" level is applied to the base of transistor T1 and a "0" level is applied to the bit line BL. The result is a voltage of at least 3.5 volts across the dielectric layer. The application of at least 3.5 volts across the dielectric layer results in its breakdown and the loading of a "1" state in the data cell. A means for programming the cells as described above is shown in FIG. 4 and will be further explained hereinafter.

Figure 3:
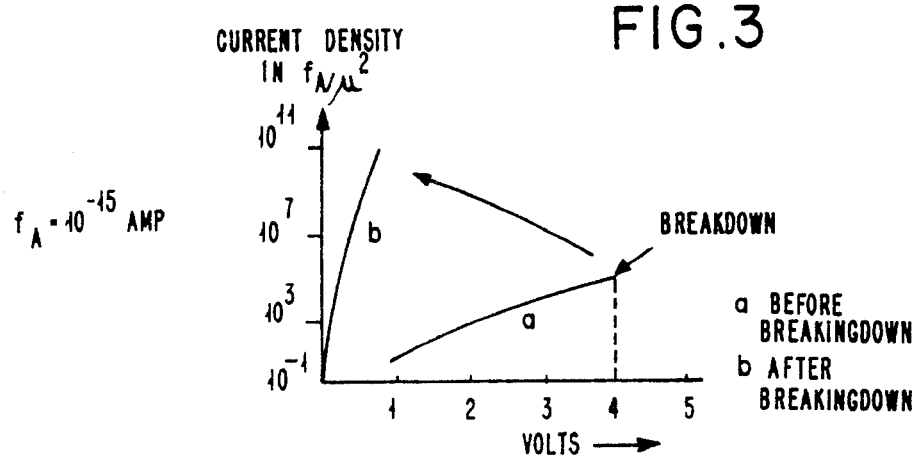
FIG. 3 is a graphic representation of the current density in a memory cell using the preferred dielectric in accordance with this invention before and after programming.

FIG. 3 is a graphic representation of the current density in the memory cell versus voltage at the emitter dielectric layer as the cell is programmed for preferred dielectric materials such as the oxides and titanates of transition metals. Portion "a" of the curve represents the current density in a cell prior to breakdown of the emitter dielectric layer. Portion "a" of the curve shows that prior to breakdown, the current density is low. In this condition, the cell exhibits the characteristic of a conventional nonprogrammable read only memory cell in which the emitter is open.

As shown in FIG. 3, as voltage is increased, the current in the cell increases by a small amount until breakdown of the dielectric layer is achieved. At breakdown, which in preferred form typically results with the application of a minimum of 3.5 volts, the cell readily conducts current as shown in curve portion "b". Curve portion "b" represents the current carrying characteristic for the cell after breakdown of the dielectric, i.e., loading of a "1" level.

It is a principal feature of this invention that the breakdown voltage be low enough to be compatible with the high density integrated circuit, i.e., to be of a few volts. Also, the breakdown of the dielectric layer is made low so as to be sufficiently controllable to permit use of simple programming circuits. The other electrical characteristics of the dielectric layer, e.g., leakage current and capacitance, are not critical. The leakage current of a cell with a surface area of $10\mu^2$ before dielectric breakdown can be of the order of 1 microamp per volt in the high impedance condition (curve "a").

In accordance with this invention, dielectric layer materials are preferred to have a low energy band as, for example, 2 to 5 eV. Such materials are suitable because they show a lower dielectric strength and accordingly have a low breakdown voltage for material thicknesses which can be uniformly and repeatably achieved as, for example, from $20 \times 10^{-6}$ to $100 \times 10^{-6}$ mm. More particularly, materials with dielectric strengths of between $10^5$ to $10^6$ volts per centimeter are preferred. Materials with high dielectric constant known in the art, e.g., U.S. Pat. No. 3,576,549, are not desirable for the application considered here because the thickness of material required for uniformity results in high breakdown voltages, e.g., 5 to 100 volts. The materials which are preferred to form the dielectric layer in accordance with this invention include transition metal oxides or titanates such as tantalum oxide, vanadium oxide, zirconium oxide, niobium oxide, barium titanate and strontium titanate.

As noted, however, other materials may also be used if higher breakdown voltages can be tolerated as, for example, amorphous silicon or amorphous silicon enriched with 1–2 percent of oxygen, and materials chemically applied under low pressure such as silicon dioxide ($SiO_2$), alumina ($Al_2O_3$) or silicon nitride ($Si_3N_4$). Because these materials have higher dielectric strength, thinner layers on the order of $10 \times 10^{-6}$ mm must be used to get desirable, i.e., low, program voltages. These thin layers, however, are more difficult to obtain. Accordingly, a principal advantage, in the form of ease of manufacture, is obtained by providing the cells with a dielectric which is an oxide or titanate of a transition metal.

FIG. 4 shows a memory having an array of cells of the type shown in FIG. 1. Additionally, FIG. 4 shows a means for programming the memory, i.e., loading the memory with the desired binary data. For the array shown, the "0" is represented by the high impedance condition and the "1" by the low impedance condition. As will be appreciated by those skilled in the art, it is possible to adopt a contrary convention without departing from the scope of this invention.

With regard to FIG. 4, the memory includes cells C arranged in M rows and N columns. The cells are provided at the intersection of the word lines WL1 to WLN with the bit lines BL1 to BLM. For simplicity, only two of the N word lines and several groupings of the M bit lines are shown. For ease of identification, a cell located at the intersection of word line WLI with bit line BLK is designated CIK. More particularly, the cell C11 is located at the intersection of word line WL1 and bit line BL1. With such an array of memory cells, it is possible to provide a network comprising, for example, 288 bit lines and 256 word lines.

With reference to FIGS. 1, 2 and 4, and in accordance with this invention, the base of the cell transistors of each column are connected to a word line. The bases of the cells of the first column are, for example, connected to word line WL1 and the bases of the cells of the last column, i.e., N, are connected to word line WLN.

Figure 5:
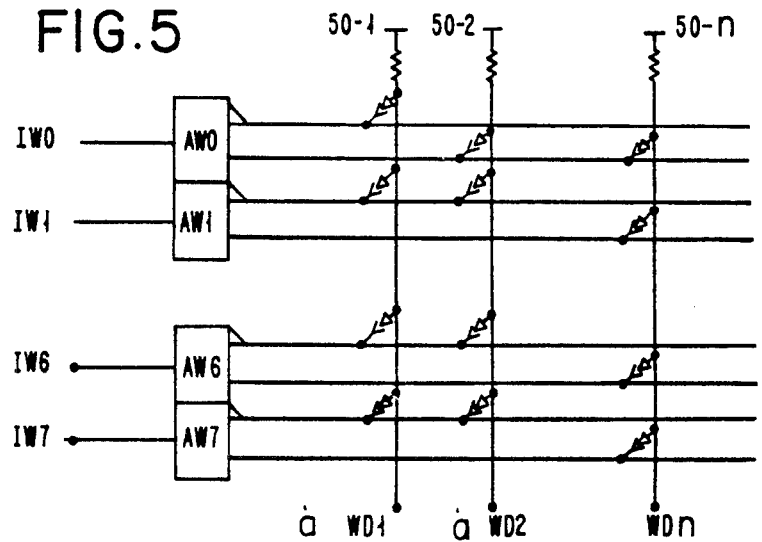
FIG. 5 is an illustration of a word line address decoder which may be used in conjunction with the PROM of this invention.

With reference to FIG. 4, the word lines are addressed by a word line address decoder 10. In accordance with the invention the address decoder may be of a conventional type. An illustration of such a circuit is shown in FIG. 5. Address decoder circuit 10 receives address signals on input lines IW0 to IW7 which in the form shown in FIG. 4 constitutes 8 such addressing signals. As shown, the 8 address signals permit up to $2^8$ word lines, i.e., 256 word lines to be addressed in a conventional manner. The output of address decoder 10 appears at terminals 11-1 to 11-N and are applied to the bases of drive transistors TD1 to TDN associated with the corresponding lines WD1 to WDN. The emitters of the drive transistors are connected to word lines WL1 to WLN. To select a particular word line, the appropriate output terminal of the address decoder generates a signal which causes the drive transistor associated with the desired line to conduct. In this arrangement, the drive transistors associated with the unselected lines are blocked.

The drive transistor collectors are connected to terminals 12-1 to 12-N, respectively, at which the appropriate biasing voltages can be applied. The bases of the drive transistors, in addition to being connected to the word line address decoder, are also connected to the anodes of diodes D1 to DN, respectively, which in preferred form are of the Schottky type. The cathodes of diodes D1 to DN are in turn connected to terminals 13-1 to 13-N, respectively, at which appropriate voltages can be applied as will be described hereinafter. The emitters of the drive transistors in addition to being connected to their respective word lines are also connected to terminals 14-1 to 14-N through resistors R1 to RN.

With reference to FIGS. 1, 2 and 4, point B of the cells of like rows are connected to a bit line BL. The M bit lines BL1 to BLM are arranged in K groups comprised of M/K lines. In this embodiment where M is equal to 288, K equals 16. Therefore, the bit lines are arranged in 16 groups of 18 lines which allows the 18 bit lines of a word to be simultaneously addressed. Each group is addressed by 16 bit sense lines BS1 to BS16. Each of sense the lines BS1 to BS16 is connected to 18 bit lines, as schematically shown in FIG. 4. As will be appreciated by those skilled in the art, this arrangement is well known and does not form part of this invention.

Figure 6:
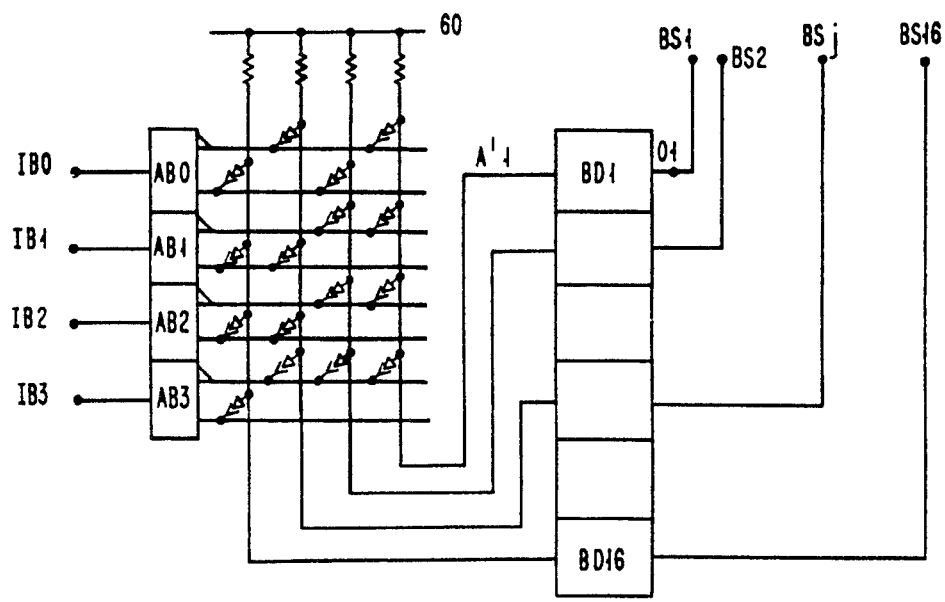
FIG. 6 is an illustration of a bit line address decoder which may be used in conjunction with the PROM of this invention.

As shown in FIG. 4, bit lines BS1 to BS16 are selected by a bit line address decoder 15. As shown, bit line address decoder 15 has four address signal inputs at IB0 to IB3. These four address signals generate appropriate signals at output terminals 16-1 to 16-N to select one of the bit sense lines BS1 to BS16. A circuit which can be used to perform this function is shown in FIG. 6. Bit lines BL1 to BLN are connected to bit sense lines BS1 to BS16 through resistors 17-1 to 17-M and also to 18 detect and program circuits 18-1 to 18-8.

For simplicity, FIG. 4 shows only two detect and program circuits 18-1 and 18-18. As seen, the circuits are alike. Accordingly, only circuit 18-1 need be described. As seen in FIG. 4, circuit 18-1 includes 16 transistors 19-1 to 19-16 the emitters of which are connected to the bit line selected by bit sense lines BS1 to BS16. The bases of transistors 19-1 to 19-16 are connected together and to terminal 20. Likewise, the collectors of transistors 19-1 to 19-16 are connected to common terminal 21. The anode of an anti-saturation diode S1, which in preferred form is of the Schottky type, is connected to terminal 20 and its cathode is connected to point 21.

In accordance with this invention, terminal 20 is provided with a first voltage appropriate for biasing the memory in the read mode, and with a second voltage appropriate for personalizing the memory when in the programming mode.

Circuit 18-1 also includes a read circuit section at whose output the data bits are provided. This circuit section includes resistors 23 and 24, each having a first terminal electrically connected to common point 21'. The second terminal of resistor 24 is connected to point 21, described above, and the second terminal of resistor 23 is connected to a terminal 25 at which the appropriate read and program voltages are applied depending upon the mode the memory is in.

Common point 21' of resistors 23 and 24 is connected to the collector and base of a transistor 26, which functions as a diode. The emitter of transistor 26 is connected to the base of a transistor 27 biased by a resistor 28 connected between the base of transistor 27 and ground. The emitter of transistor 27 is also connected to ground. The collector of transistor 27 is connected through a resistor 29 to a terminal 30 at which a first voltage is applied when the memory is in the read mode and at which a second voltage is applied when the memory is in the program mode. An anti-saturation diode S2 which in preferred form is of the Schottky type is provided between the collector and base of transistor 27.

In a preferred embodiment, the values of the various voltages applied to the different terminals are as shown in Table 1. It will be appreciated by those skilled in the art that various voltage values may be used to read and program the memory, provided that the dielectric material is not broken down when the memory is in the read mode, and provided the dielectric material is broken down when the memory is in the program mode.

TABLE 1

| Terminals | Read Mode Voltage | Program Mode Voltage |
| --- | --- | --- |
| 12-1 to 12-N | +3.4v | +5v |
| 13-1 to 13-N | +2.05v | +5v |
| 14-1 to 14-N | +1.0v | +1v |
| 20-1 to 20-N | +1.4v | +5v for 0, +0.8v for 1 |
| 25-1 to 25-N | +3.4v | +5v |

TABLE 1-continued

| Terminals | Read Mode Voltage | Program Mode Voltage |
|---|---|---|
| 30-1 to 30-N | +1.7v | +5v |

The operation of the memory in accordance with this invention is as follows. Assuming the cells are fabricated as shown in FIG. 1, "0"'s exist in all the memory cells. To program a "1" in a particular cell, i.e., to break down the dielectric at a particular cell, terminals 12-1 to 12-N of address decoder circuit 10 and terminals 13-1 to 13-N are set to a high value of +5 v. Assuming cell C11 is desired to be given a "1" state, word line WL1 and bit line BL1 are addressed. More particularly, since 12-1 is set to 5 v, when an address signal is presented to the base of drive transistor WD1, it conducts with the result that the voltage across the base of cell C11's transistor is slightly lower than +5 v. Additionally, bit line BL1 is selected by lowering the potential on line BS1. Where terminal 20 is set to 0.8 v, the resulting voltage across the terminals of the dielectric layer is approximately 4.2 v with the result that the dielectric layer is broken down.

If, however, a voltage of 5 v is applied at terminal 20, the dielectric layer is not broken down. Terminals 25 and 30 are set to 5 v in the program mode to protect the transistors.

In the read mode, the array operates as a personalized memory with the cells being loaded with "1"'s or "0"'s depending on whether or not the cell transistor emitter dielectric has been broken down. To read the condition of a cell or series of cells, the desired word line and bit lines are selected and circuits 18-1 to 18-18 provide the binary information at outputs 22 which correspond to the states of the address cells. This is conventional operation and need not be described further.

FIGS. 5 and 6 show two decode circuits which can be respectively used as the word line address decoder 10 and the bit line address decoder 15. The word line address decoder circuit 10 of FIG. 5 includes a true/-complimentary value generators A-0 to A-7 having inputs for receiving address signals IW0 to IW7 respectively. True/complementary value generators AW0 to AW7 also have multiple outputs. The first output of a generator, for example, AW0, is designated AW01 and provides the complementary value of the respective input signal IW0. The second output of the value generator, for example, AW02, provides the true value of the input signal IW0. The decoder also includes a matrix of diodes which in preferred form are of the Schottky type. In this arrangement, each vertical line of the matrix is connected to the base of one of the drive transistors WD1 to WDN as shown in FIG. 4. The horizontal lines of the matrix are defined by the first and second output lines of value generators AW0 to AW7. The diodes are arranged in the maxtrix such that the diode anodes are connected to the vertical lines and the cathodes to the horizontal lines. Accordingly, when the addressing signal of a word line, for instance 00000000 for line WL1, is applied to inputs IW0 to IW7, the corresponding diodes are all blocked to allow a high level signal equal to the voltage across terminal 50-1 be applied to the base of transistor WD1 only. In the program mode this voltage is 5 volts and in the read mode it is 3.4 volts.

The bit line address decoder is shown in FIG. 6. As shown, bit line address decoder 15 is similar to word line address decoder 10 except it includes only four true/complement value generators AB0 to AB3. These generators receive the bits of addressing signals IB0 to IB3 since only one line among the 16 lines BS1 to BS16 is to be selected. Bit line address decoder 15 also includes drive circuits BD1 to BD16 which allow a low level to be applied to the selected lines BS1 to BS16.

FIG. 7 and FIG. 8 illustrate the structural form of two memory cells.

As shown, the cells illustrated are cells C11 and C12 of FIG. 4, connected to word lines WL1 and WL2 (cell C12 and word line WL2 not being shown in FIG. 4) and to bit line BL1. As shown in FIG. 8, bit line BL1 is located at the first metallization level and word lines WL1 and WL2 are connected to a second metallization level. The two levels are separated by an insulating material. The transistors of each cell are provided with a P-doped base at layer 70. In FIG. 7, the base layer for the respective cells C11 and C12 bear the reference numerals 70-1 and 70-2. The cell transistor emitters are provided at an N+ region 71. As shown in FIG. 8 and in accordance with this invention, a dielectric layer 2 is arranged on the N+ emitter region 71. A transistor collector is provided at region 72 as shown in FIG. 8.

As seen in FIG. 7, the cell transistor base contacts are designated 73-1 and 73-2 and the emitter openings are designated 74-1 and 74-2. Continuing with reference to FIG. 7, word lines WL1 and WL2 are connected to the transistor base regions 73-1 and 73-2, respectively, through via couplings 75-1 and 75-2.

The collector contacts for the cell transistors are not shown in FIGS. 7 and 8. Since the collectors of several cells are connected to the same voltage, it is possible to have a common contact for several transistors which is located at an appropriate point in the assembly. This arrangement is conventional and will not be described further.

Therefore, FIGS. 7 and 8 show that the memory assembly can be very dense since the dielectric layer does not occupy additional surface area on the silicon material.

While the memory assembly has been described in a preferred embodiment, it will be appreciated by those skilled in the art that deviations and modifications of the particular details disclosed can be made without departing from the true spirit of the invention.

What we claim is:

1. In an electrically programmable read only memory including a matrix of first and second type information lines, the matrix having memory cells located at the intesections of at least some of the first and second type information lines and means for storing information in the cell, the improvement comprising:
  a memory cell having a transistor including collector, base and emitter regions, the base region of the transistor being connected to an information line of the first type and the collector region being adapted to be connected to a variable voltage supply, the memory cell also including a dielectric layer which is an oxide or titanate of a transition metal having a first surface directly overlying at least a portion of the transistor emitter region and a second surface in electrical communication with an information line of the second type; and
  means for electrically puncturing the dielectric layer at selected cells to establish an ohmic contact between the transistor emitter region and the second type information line when storing information in the cell.

2. The memory in accordance with claim 1 wherein the information lines of the first and second type are, respectively, word and bit lines and wherein the cell transistor base region is electrically connected to a word line and the cell dielectric layer is coupled to a bit line.

3. The memory in accordance with claim 1 or 2 wherein the dielectric layer is tantalum oxide.

4. The memory in accordance with claim 1 or 2 wherein the dielectric layer is vanadium oxide.

5. The memory in accordance with claim 1 or 2 wherein the dielectric layer is zirconium oxide.

6. The memory in accordance with claim 1 or 2 wherein the dielectric layer is niobium oxide.

7. The memory in accordance with claim 1 or 2 wherein the dielectric layer is barium titanate.

8. The memory in accordance with claim 1 or 2 wherein the dielectric layer is strontium titanate.

9. The memory in accordance with claim 1 or 2 wherein the dielectric layer has a thickness of between $20 \times 10^{-6}$ and $100 \times 10^{-6}$ mm.

10. The memory in accordance with claim 9 wherein the dielectric layer has a breakdown voltage between 1 and 4 volts.

* * * * *